United States Patent
Won

(10) Patent No.: US 10,462,418 B2
(45) Date of Patent: Oct. 29, 2019

(54) ELECTRONIC DEVICE, DISPLAY DEVICE, AND DISPLAY SYSTEM INCLUDING ELECTRONIC DEVICE AND DISPLAY DEVICE

(71) Applicant: SAMSUNG ELECTRONICS CO., LTD., Suwon-si (KR)

(72) Inventor: Kang Young Won, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/717,077

(22) Filed: Sep. 27, 2017

(65) Prior Publication Data

US 2018/0091770 A1 Mar. 29, 2018

(30) Foreign Application Priority Data

Sep. 27, 2016 (KR) .......................... 10-2016-0123759

(51) Int. Cl.
*H04N 17/00* (2006.01)
*H04N 7/10* (2006.01)
(Continued)

(52) U.S. Cl.
CPC ......... *H04N 7/102* (2013.01); *G01R 31/2812* (2013.01); *G09G 3/006* (2013.01);
(Continued)

(58) Field of Classification Search
CPC ..... G01R 31/2812; H04N 7/102; G09G 3/006
(Continued)

(56) References Cited

U.S. PATENT DOCUMENTS 6,859,200 B2    2/2005 Park et al.
8,149,233 B2    4/2012 Kim et al.
(Continued)

FOREIGN PATENT DOCUMENTS

KR    10-2007-0071952 A    7/2007
KR    10-2017-0041998 A    4/2017

OTHER PUBLICATIONS

Search Report dated Jan. 16, 2018, issued by the International Searching Authority in counterpart International Patent Application No. PCT/KR2017/010596 (PCT/ISA/210).
Written Opinion dated Jan. 16, 2018, issued by the International Searching Authority in counterpart International Patent Application No. PCT/KR2017/010596 (PCT/ISA/237).

*Primary Examiner* — Jefferey F Harold
*Assistant Examiner* — Jean W Desir
(74) *Attorney, Agent, or Firm* — Sughrue Mion, PLLC

(57) ABSTRACT

An electronic device is provided. The electronic device may include a wired communication interface connected to a display device through a cable, and a controller that transmits a test signal, which includes specified data, to the display device through the wired communication interface and receives error check information regarding the test signal from the display device through the wired communication interface. The controller may sequentially change transmission characteristic values of the test signal within a specified range to transmit a plurality of test signals, and perform calibration for changing a transmission characteristic of a signal to be transmitted to the display device based on the error check information regarding the plurality of test signals.

16 Claims, 10 Drawing Sheets

(51) Int. Cl.
   *G01R 31/28*   (2006.01)
   *H04N 7/015*   (2006.01)
   *H04N 7/035*   (2006.01)
   *H04N 17/04*   (2006.01)
   *G09G 3/00*    (2006.01)
   *G06K 9/00*    (2006.01)

(52) U.S. Cl.
   CPC ........... *H04N 7/015* (2013.01); *H04N 7/0357* (2013.01); *H04N 17/045* (2013.01); *G06K 9/00536* (2013.01)

(58) Field of Classification Search
   USPC ......... 348/177, 180, 181; 375/224, 227, 229
   See application file for complete search history.

(56) References Cited

U.S. PATENT DOCUMENTS

| | | |
|---|---|---|
| 9,293,075 B2 | 3/2016 | Han |
| 2002/0080128 A1 | 6/2002 | Park et al. |
| 2006/0184331 A1 | 8/2006 | Kim et al. |
| 2007/0053667 A1* | 3/2007 | Sunakawa ............... H04N 19/61 386/230 |
| 2012/0327250 A1* | 12/2012 | Zhang .................... G09G 5/006 348/180 |
| 2013/0113777 A1 | 5/2013 | Baek et al. |
| 2014/0226025 A1 | 8/2014 | Han |
| 2017/0104987 A1 | 4/2017 | Won |

* cited by examiner

ELECTRONIC DEVICE, DISPLAY DEVICE, AND DISPLAY SYSTEM INCLUDING ELECTRONIC DEVICE AND DISPLAY DEVICE

CROSS-REFERENCE TO RELATED APPLICATION(S)

This application claims priority from a Korean Patent Application No. 10-2016-0123759, filed on Sep. 27, 2016 in the Korean Intellectual Property Office, the disclosure of which is incorporated herein in its entirety by reference.

BACKGROUND

1. Field

Apparatuses and methods consistent with example embodiments relate to an electronic device, a display device, and a display system including the electronic device and the display device, capable of performing the calibration of the impedance of a printed circuit board (PCB) and the calibration of a signal which is transceived.

2. Description of the Related Art

A source device and a display device may include a printed circuit board (PCB) having several elements mounted thereon to operate the devices and having conductive line patterns formed thereon to transmit a signal between the mounted elements. The source device and the display device may be connected with each other through a cable and thus an image transmitted from the source device may be displayed on a display.

Recently, as high-resolution and high-quality videos are becoming more commonplace with the development of multimedia technologies, ultra-high definition (UHD) videos having the resolution four times higher than that of high-definition (HD) videos are gaining popularity.

When high-resolution and high-quality videos are transmitted from the source device to the display device, a high-speed signal ranging from hundreds of megabits per second to several gigabits per second may be transmitted through the conductive line patterns and cables on the PCB.

SUMMARY

When a signal is transmitted between devices through the conductive line patterns on PCBs of the source device and the display device, and when the impedance value of the PCB becomes different from a design value due to the error or inaccuracies in the manufacturing process of the PCBs, the transmitted signal may be distorted due to the impedance mismatching.

In addition, when the electronic device and the display device are connected with each other through a cable and transmit a signal, the signal may be distorted due to the impedance of the cable itself connected with the PCB and an external influence exerted on the cable.

Aspects of the present disclosure are to address at least the above-mentioned problems and/or disadvantages and to provide at least the advantages described below. Accordingly, an aspect of the present disclosure is to provide an electronic device, a display device, and a display system including the electronic device and the display device, capable of performing calibration for correcting the impedance of the PCB and for changing the characteristic of a signal transmitted through a cable.

In accordance with an aspect of an example embodiment, the electronic device may include a wired communication interface connected to a display device through a cable, and a controller that transmits a test signal, which includes specified data, to the display device through the wired communication interface and receives error check information regarding the test signal from the display device through the wired communication module. The control module may sequentially change transmission characteristic values of the test signal within a specified range to transmit a plurality of test signals, and perform calibration for changing a transmission characteristic of a signal to be transmitted to the display device based on the error check information regarding the plurality of test signals.

In accordance with an aspect of an example embodiment, a display device may include a wired communication interface connected to an electronic device through a cable, and a controller that receives a test signal including specified data from the electronic device through the wired communication interface, and examine the specified data, and check for an error in the test signal. The controller may sequentially change reception characteristic values of the test signal within a specified range to receive a plurality of test signals, and perform calibration for changing a characteristic of a signal to be received from the electronic device based on error check information regarding the plurality of test signals.

In accordance with an aspect of an example embodiment, a display system may include an electronic device connected with a display device through a cable to transmit a test signal including specified data to the display device, and to receive error check information regarding the test signal from the display device, and a display device connected with the electronic device through the cable to receive the test signal including the specified data from the electronic device, to examine the specified data to check for an error in the test signal, and to transmit the error check information regarding the test signal to the electronic device. The electronic device may sequentially change transmission characteristic values of the test signal within a first specified range to transmit a plurality of test signals, and perform calibration for changing a transmission characteristic of a signal to be transmitted to the display device based on the error check information regarding the plurality of test signals. The display device may sequentially change reception characteristic values of the test signal within a second specified range to receive the plurality of test signals, and perform calibration for changing a reception characteristic of the signal received from the electronic device based on the error check information regarding the plurality of test signals.

Other aspects, advantages, and salient features of the disclosure will become apparent to those skilled in the art from the following detailed description, which, taken in conjunction with the annexed drawings, discloses various example embodiments of the present disclosure.

According to various example embodiments of the present disclosure, the electronic device and the display device may determine the impedances of the PCBs and perform calibration for correcting the impedances of the PCBs if the determined impedance of the PCBs differ from set values, thereby stably transceiving the signal.

In addition, the electronic device and the display device may mutually transceive the test signal, may check for the error in the transceived test signal transmitted from the electronic device to the display device, and may perform the calibration for changing the characteristic of the signal based on the error check information, thereby stably transceiving the signal.

Besides, a variety of effects directly or indirectly understood through this disclosure may be provided.

BRIEF DESCRIPTION OF THE DRAWINGS

The above and/or other aspects, features, and advantages will be more apparent from the following description of example embodiments, taken in conjunction with the accompanying drawings, in which.

DETAILED DESCRIPTION OF EXAMPLE EMBODIMENTS

Figure 1:
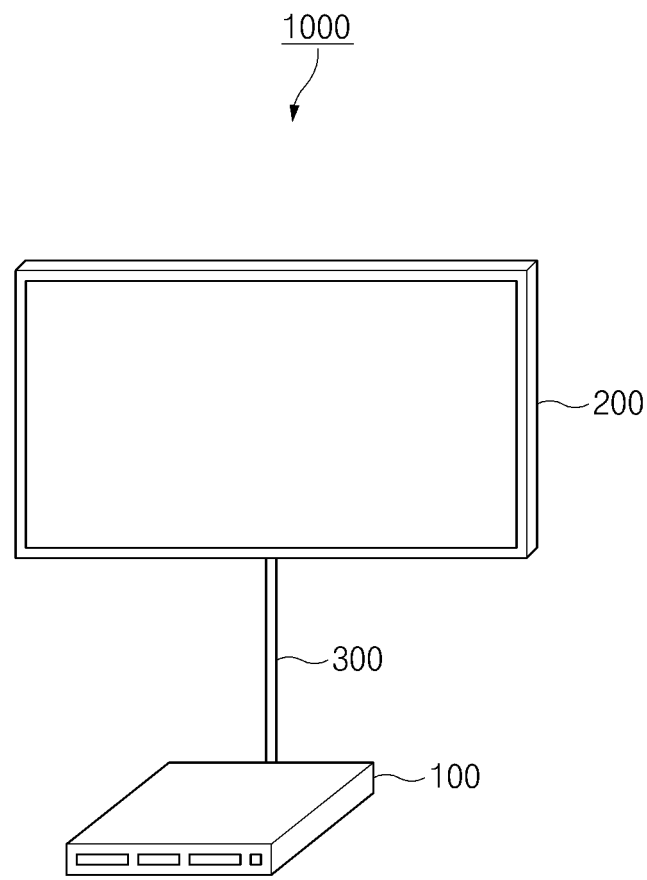
FIG. 1 is a view illustrating a display system, according to an example embodiment.

Hereinafter, various example embodiments of the present disclosure may be described with reference to accompanying drawings. Accordingly, those of ordinary skill in the art will recognize that modification, equivalent, and/or alternative on the various example embodiments described herein may be variously made without departing from the scope and spirit of the present disclosure. With regard to description of drawings, similar elements may be marked by similar reference numerals.

In the present disclosure, the expressions "have," "may have," "include," "comprise," "may include," and "may comprise" used herein indicate existence of corresponding features (e.g., elements such as numeric values, functions, operations, or components) but do not necessarily exclude presence of additional features.

In the present disclosure, the expressions "A or B," "at least one of A and B", "at least one of A or B," "one or more of A and B," "one or more of A or B," and the like may include any and all combinations of one or more of the associated listed items. For example, the term "A or B," "at least one of A and B," or "at least one of A or B" may refer to all of the case (1) where at least one A is included, (2) where at least one B is included, or (3) where both of at least one A and at least one B are included.

The terms such as "first,", "second," and the like used in the present disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing from the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

The expression "configured to" used in the present disclosure may be used as, for example, the expression "suitable for," "having the capacity to," "designed to," "adapted to," "made to," or "capable of." The meaning of the term "configured to" is not limited to "specifically designed to" in hardware. Instead, the expression "a device configured to" may also mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the present disclosure are used to describe example embodiments and are not intended to limit the scope of the present disclosure. The terms of a singular form may include plural forms unless otherwise specified and vice versa. All the terms used herein, which include technical or scientific terms, may have the same meaning that is generally understood by a person skilled in the art. It will be further understood that terms, which are defined in a dictionary and commonly used, should also be interpreted as being customary in the relevant related art and not in an idealized or overly formal unless expressly so defined in various example embodiments of the present disclosure. In some cases, even if terms are defined in the present disclosure, they may not be interpreted to exclude embodiments of the present disclosure.

FIG. 1 is a view illustrating a display system according to an example embodiment.

Referring to FIG. 1, a display system 1000 may include an electronic device 100, a display device 200, and a cable 300.

The electronic device 100 may be connected with the display device 200 to transmit an image to the display device 200 and may display the image on the display device 200.

According to an aspect of an example embodiment, the electronic device 100 may be connected with the display device 200 in a wired manner. For example, the electronic device 100 may be connected with the display device 200 via serializer/deserializer (SerDes), High-Definition Multimedia Interface (HDMI), Digital Visual Interface (DVI), Video Graphics Array (VGA), or the like.

The electronic device 100 may control the display device 200 to display the transmitted image on the display device 200. For example, the electronic device 100 may include a main processor for controlling the display device 200. The electronic device 100 may transmit an image signal and a control signal to the display device 200 to display the image on the display device 200. For example, the image may be an image received from an external electronic device. The external electronic device may be connected with the electronic device 100 in any one of wired and wireless manners. Alternatively, the image may be an internal image stored in the electronic device 100. The electronic device 100 may reproduce the stored image and may transmit the image to the display device 200.

According to an aspect of an example embodiment, the electronic device 100 may be connected with the display device 200 through the cable 300 to establish the connection for transmitting an image. For example, to successfully transmit a signal, the electronic device 100 may perform calibration for changing an impedance of a printed circuit board (PCB) and the characteristic of the signal which is to be transmitted.

The display device 200 may be connected with the electronic device 100 to receive an image and may display the image on a display.

According to an aspect of an example embodiment, the display device 200 may be controlled by the electronic device 100. For example, the display device 200 may receive the image signal and the control signal from the electronic device 100 to display the image on the display.

The display device 200 may be connected with the electronic device 100 through the cable 300 to establish the connection for receiving an image. For example, to successfully receive a signal, the display device 200 may perform calibration for changing an impedance of a PCB and the characteristic of the received signal.

The cable 300 may connect the electronic device 100 with the display device 200. The cable 300 may include a plurality of lines, and the electronic device 100 and the display device 200 may transceive (e.g., transmit, receive, exchange) a signal through the lines. In the cable 300, interference or distortion may be caused to the transceived signal due to the impedance of the cable itself, the interference between the lines of the cable 300, and an external environment of the cable 300. Accordingly, when the cable 300 is connected with the electronic device 100 and the display device 200, calibration may be performed for changing the impedance of the PCB and the characteristic of the transceived signal.

Figure 2:
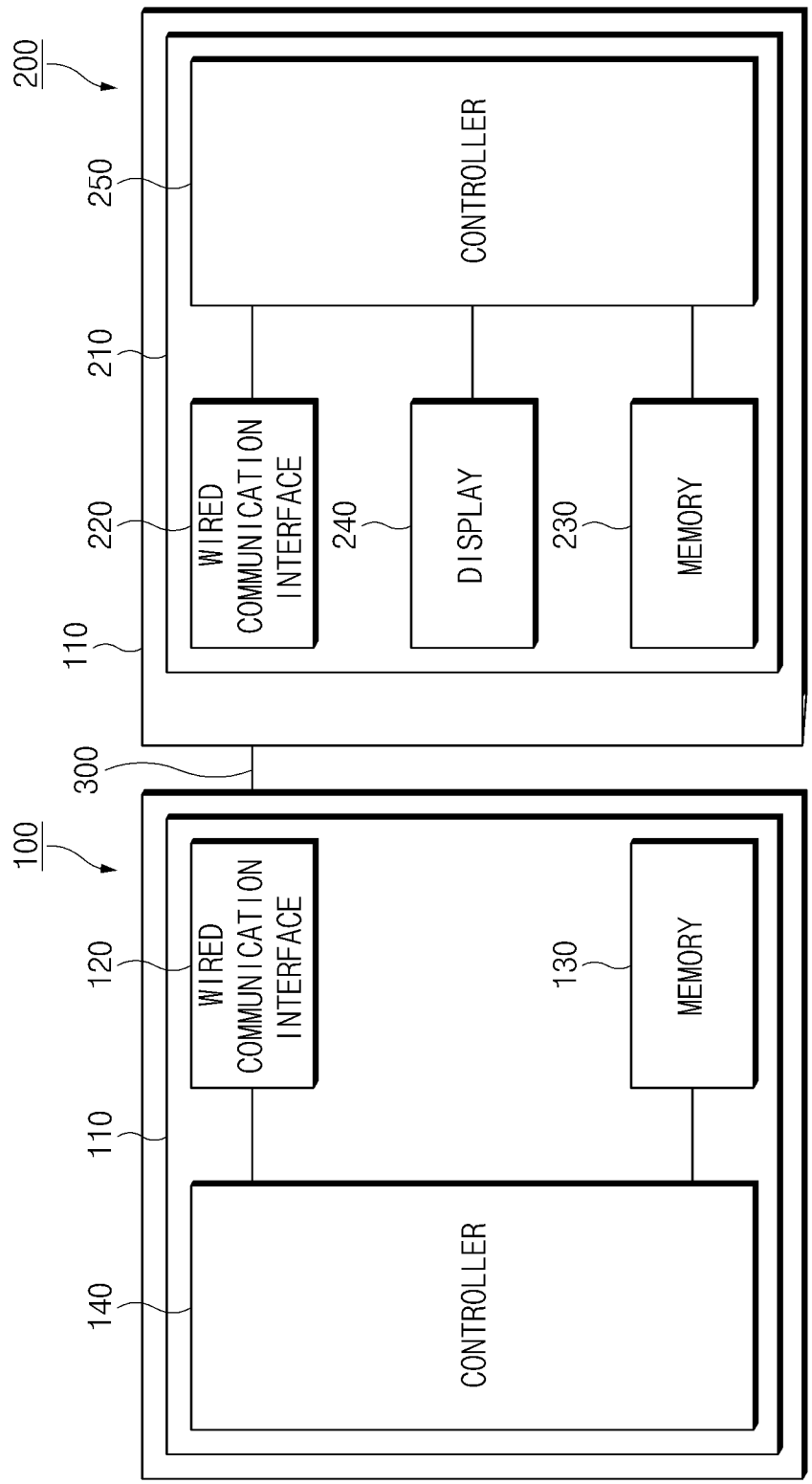
FIG. 2 is a block diagram illustrating elements of an electronic device and a display device, according to an example embodiment.

FIG. 2 is a block diagram illustrating elements of the electronic device and the display device, according to an example embodiment.

Referring to FIG. 2, the electronic device 100 and the display device 200 are connected with each other through the cable 300 to transceive a signal.

The electronic device 100 may include a PCB 110, a wired communication interface 120, a memory 130, and a controller 140.

The PCB 110 may include various elements including the wired communication interface 120, the memory 130, and the controller 140. The various elements may be mounted on the PCB 110. The PCB 110 may include a conductive line pattern formed to transmit a signal between the various elements. The PCB 110 may include a substrate formed of an epoxy resin or a bakelite resin serving as an insulator, and the substrate may have a conductive line pattern formed using a copper thin film. For example, the substrate may be formed in a plurality of layers.

According to an aspect of an example embodiment, in the PCB 110, the stack-up of the layers of the PCB 110 and the width of the conductive line pattern may become different from design values due to the errors in the manufacturing process. In the case that the PCB 110 is manufactured with values different from the design values, the impedance of the PCB 110 itself may become different from a designed (e.g., intended) impedance value. For example, if the impedance of the PCB 110 is different from the designed impedance value, the level of a signal transmitted by the electronic device 100 may be degraded or distorted due to impedance mismatching. For example, the impedance mismatching may more greatly affect the signal transmitted by the electronic device 100 if the signal transmitted by the electronic device 100 is a high-speed signal.

The wired communication interface 120 may be connected with the display device 200 in a wired manner to transceive a signal. For example, the wired communication interface 120 may be connected with the display device 200 via SerDes, HDMI, DVI, VGA, or the like.

The memory 130 may store related data used to perform the operation of the controller 140. For example, the memory 130 may be a non-volatile memory such as a flash memory or a hard disk drive. Alternatively, the memory 130 may be a volatile memory such as a random access memory (RAM).

According to an aspect of an example embodiment, the memory 130 may store information used when the controller 140 determines and corrects the impedance of the PCB 110. The information used to determine and correct the impedance of the PCB 110 may be a voltage value applied to a resistor to measure the impedance of the PCB 110. The memory 130 may store information used to change the transmission characteristic of a signal transmitted by the electronic device 100. The information used to change the transmission characteristic of the signal transmitted may be information on strength, pre-emphasis, duty ratio, and/or skew of the signal.

The controller 140 may control the overall operation of the electronic device 100. For example, the controller 140 may determine and correct the impedance of the PCB 110. Alternatively, the controller 140 may change a transmission characteristic value of the signal, which is used to transmit the signal to the display device 200 when the cable 300 is connected with the electronic device 100 and the display device 200.

Figure 3:
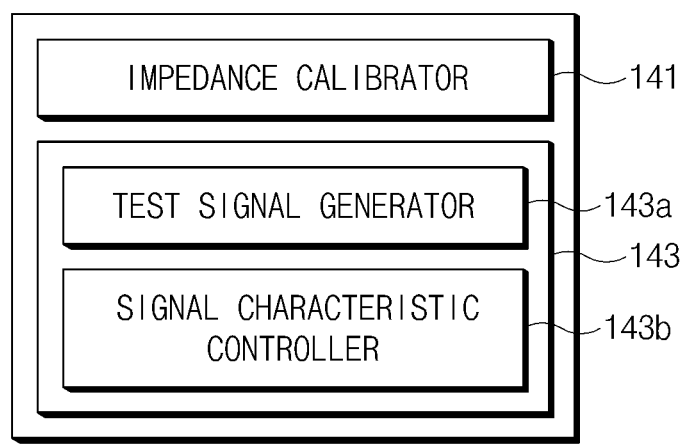
FIG. 3 is a block diagram illustrating a control module of the electronic device, according to an example embodiment.

FIG. 3 is a block diagram illustrating the controller of the electronic device, according to an example embodiment.

Referring to FIG. 3, the controller 140 may include an impedance calibrator 141 and a signal calibrator 143. For example, the controller 140 may include a main processor which controls the display device 200. The controller 140 may transmit an image signal and a control signal to the display device 200. The controller 140 may be implemented in the form of a system on chip (SoC) including a central processing unit (CPU), a graphics processing unit (GPU), and/or a memory. Each of the components shown in FIG. 3 and other figures may be implemented as a module, a unit, a logic, a logical block, a component, a circuit, etc. with hardware, software, or a combination of both.

The impedance calibrator 141 may determine the impedance of the PCB 110 and may correct the impedance of the PCB 110 if the impedance of the PCB 110 is different from a specified impedance (e.g., a design value) stored in the memory 130.

Figure 4:
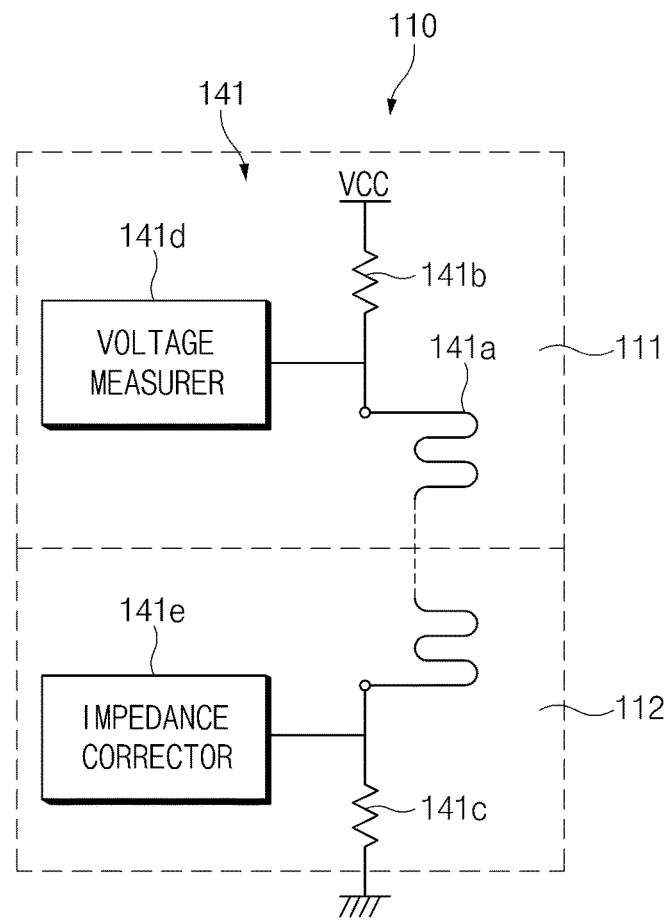
FIG. 4 is a block diagram illustrating an impedance calibration module of the electronic device, according to an example embodiment.

FIG. 4 is a block diagram illustrating the impedance calibrator of the electronic device, according to an example embodiment.

Referring to FIG. 4, the impedance calibrator 141 may include a conductive line pattern 141a, a first resistor 141b, a second resistor 141c, a voltage measurer 141d, and an impedance corrector 141e.

The conductive line pattern 141a may be formed on the substrate of the PCB 110. For example, the conductive line pattern 141a may be formed at each of a plurality of layers of the substrate. Conductive line patterns 141a formed at the layers may be connected with each other.

The first resistor 141b may be connected between one end (or, a first end) of a first conductive line pattern 141a and a power supply. For example, the first resistor 141b may be disposed at the uppermost layer 111 of the substrate, to which the power supply of the PCB 110 is connected, and may be connected between one end of the conductive line pattern 141a and the power supply.

The second resistor 141c may be connected between an opposite end (or, a second end) of the conductive line pattern 141a and a ground. For example, the second resistor 141c may be disposed at the lowermost layer 112 of the substrate, to which the ground of the PCB 110 is connected, and may be connected between the opposite end of the conductive line pattern 141a and the ground.

The voltage measurer 141d may measure a voltage applied to at least one of the first resistor 141b and the second resistor 141c. For example, the voltage measurer 141d may measure a voltage between the conductive line pattern 141a and the first resistor 141b to measure the voltage applied to at least one of the first resistor 141b and the second resistor 141c. The voltage measured by the voltage measurer 141d may be a voltage V2 applied to the second resistor 141c. A voltage V1 applied to the first resistor 141b may be measured by subtracting the voltage V2 applied to the second resistor 141c from a power supply voltage VCC. The voltage V2 applied to the second resistor 141c may include a voltage applied to the conductive line pattern 141a. For example, the voltage measurer 141d may measure a voltage between the conductive line pattern 141a and the second resistor 141c to measure the voltage applied to at least one of the first resistor 141b and the second resistor 141c.

The impedance corrector 141e may correct the impedance of the PCB 110 by connecting a variable resistor with at least one of the first resistor 141b and the second resistor 141c. For example, the impedance corrector 141e may correct the impedance of the PCB 110 by changing a variable resistance as a variable resistor is connected to the second resistor 141c. For example, the impedance corrector 141e may correct the impedance of the PCB 110 by changing a variable resistance as a variable resistor is connected to the first resistor 141b.

According to an aspect of an example embodiment, the impedance calibrator 141 may determine whether the voltage (or, the first voltage), which is measured by the voltage measurer 141d, is within a specified voltage range stored in the memory 130. For example, if the measured voltage is within the specified voltage range, the impedance calibrator 141 may determine the impedance of the PCB 110 to correspond to the specified impedance. For example, if the measured voltage is not within the specified voltage range, the impedance calibrator 141 may determine the impedance of the PCB 110 to be different from the specified impedance.

If the impedance calibrator 141 determines the impedance of the PCB 110 to be different from the specified impedance, the impedance corrector 141e may change a variable resistance by connecting the variable resistor to at least one of the first resistor 141b and the second resistor 141c. For example, the impedance calibrator 141 may change the variable resistance sequentially and may determine whether the voltages (or, the second voltages) measured by the voltage measurer 141d is within the specified voltage range. The voltage may be measured under the same condition as the case that the voltage is measured before the variable resistor is connected. The impedance calibrator 141 may determine a voltages (or, third voltages), which is in the specified voltage range, among the measured voltages and may select one of resistances corresponding to the determined voltage to correct the impedance of the PCB 110.

The impedance calibrator 141 may select a resistance optimized for stable transmission of a signal as impedance matching is achieved, when selecting the resistance. For example, the impedance calibrator 141 may select a resistance closest to a mean value or a median value of a resistance corresponding to a voltage in the specified range.

After selecting the resistance of the variable resistor or determining the impedance of the PCB 110 to be equal or substantially equal to the specified impedance, the impedance calibrator 141 may transmit a test signal through the signal calibrator 143 to perform calibration of a signal to be transmitted.

Accordingly, when the impedance of the PCB 110 is different from the specified impedance, the controller 140 may perform calibration for correcting the impedance of the PCB 110.

The signal calibrator 143 of FIG. 3 may include a test signal generator 143a and a signal characteristic controller 143b. The signal calibrator 143 may transmit a test signal to the display device 200 and may change a transmission characteristic of a signal to be transmitted by checking for the error in the test signal.

The test signal generator 143a may transmit the test signal including specified data to the display device 200 through the wired communication interface 120. For example, the specified data may be data stored in the memory 130. The test signal generator 143a may transmit the test signal including the data stored in the memory 130. The specified data may be data (e.g., 10101010 . . . ) for increasing the high-low variation of the signal. The controller 140 may accurately recognize the error in the test signal in the case of transmitting the test signal including the data. Alternatively, the specified data may be a cyclic redundancy check (CRC) value calculated according to a CRC scheme. The test signal generator 143a may transmit a test signal including a CRC value of an arbitrary data. For example, the test signal generator 143a may transmit the CRC value attached to an arbitrary value.

The test signal generator 143a may generate a test signal for each frequency band (e.g., each frequency band according to predesignated divisions of frequency bands) and may transmit the test signal to the display device 200. The cable 300 may consist of multiple electrical lines and the test signal generator 143a may transmit the test signal through each line of the cable 300.

Therefore, the signal calibrator 143 may receive error check information of the test signal from the display device 200 that is able to check for the error in the test signal.

The signal characteristic controller 143b may change the transmission characteristic of the signal to be transmitted to the display device 200. For example, the transmission characteristic may be at least one of strength, pre-emphasis, duty ratio, and skew of the signal. For example, in the case of changing the strength characteristic of the signal, the signal characteristic controller 143b may uniformly increase or decrease the strength of the signal across all frequencies. In addition, in the case of changing the pre-emphasis characteristic of the signal, the signal characteristic controller 143b may increase or decrease the strength of a signal having a higher frequency among signal components. In addition, in the case of changing the duty ratio characteristic of the signal, the signal characteristic controller 143b may adjust an on-off ratio of the signal. In addition, in the case of changing the skew characteristic of the signal, the signal characteristic controller 143b may selectively increase or decrease delay values for signals transmitted through individual lines. For example, in the case that the controller 140 transmits two signals in antiphase through different lines, the signal characteristic controller 143b may increase or decrease a delay value of any one of two signals.

The signal calibrator 143 may receive the error check information of the test signal and may change the transmission characteristic of the signal to be transmitted to the display device 200 based on the received error check information.

The signal calibrator 143 may transmit the test signal to the display device 200 connected with the electronic device 100 through the cable 300. The signal calibrator 143 may receive the error check information of the test signal from the display device 200 and may examine the error check information. For example, if the error in the transmitted test signal is not within a specified error tolerance stored in the memory 130, the signal calibrator 143 may perform the calibration for changing the transmission characteristic of a signal transmitted. Alternatively, if the error in the transmitted signal is within the specified error tolerance, the signal calibrator 143 may transmit a control signal to the display device 200 such that a message notifying that the calibration is completed may be displayed on the display.

If the error in the test signal is not within the specified error tolerance, the signal calibrator 143 may change the transmission characteristic of a signal transmitted and may transmit the test signal to the display device 200. For example, the signal calibrator 143 may sequentially change the transmission characteristic values of the signal transmitted within specified ranges stored in the memory 130 and may transmit a plurality of test signals. As used herein, sequentially changing or selecting something within a range means that two or more values that fall within the range may be chosen or used in sequence to try them out. For example, if the specified range is 100-200, two or more transmission characteristic values within that range (e.g., 100, 120, 140, 160, 180, 200, etc.) may be selected and tried out one at a time in any given sequence to test the results. The signal calibrator 143 may receive error check information of the test signals from the display device 200 and may examine the error check information. For example, the signal calibrator 143 may determine whether errors of the transmitted test signals are within the specified error tolerance by examining the error check information of the test signals. The signal calibrator 143 may determine transmission characteristic values of a test signal within the error tolerance, may select one of the determined transmission characteristic values of the signal, and may change a transmission characteristic of a signal to be transmitted.

The signal calibrator 143 may change the transmission characteristic value of a signal transmitted by sequentially selecting strength, a pre-emphasis value, a duty ratio, and skew of a signal and may transmit a plurality of test signals. The signal calibrator 143 may sequentially change the selected transmission characteristic values of the test signal, may determine the transmission characteristic values of the signal within the error tolerance stored in the memory 130, and may select one of the determined transmission characteristic values of the signal.

The signal calibrator 143 may select a transmission characteristic value optimized for stable transmission of a signal when selecting the transmission characteristic value of the signal. For example, the signal calibrator 143 may select a value closest to a mean value or a median value of the transmission characteristic values of the signal transmitted within the error tolerance.

Alternatively, if the transmission characteristic value of the transmitted signal is selected, the signal calibrator 143 may transmit a control signal to the display device 200 such that a message notifying that the calibration is completed is displayed on the display.

For example, if the error in the transmitted test signal is not within the specified error tolerance, the controller 140 may perform calibration for changing the transmission characteristic of the signal to be transmitted.

The display device 200 of FIG. 2 may include a PCB 210, a wired communication interface 220, a memory 230, a display 240, and a controller 250.

The PCB 210 may be similar to the PCB 110 of the electronic device 100. The PCB 210 may include various elements including the wired communication interface 220, the memory 230, and the controller 250. The various elements may be mounted on the PCB 210. A conductive line pattern for transmitting a signal may be formed between the various elements. The conductive line pattern may be formed on the PCB 210. The PCB 210 is connected with the display 240 to display an image received from the electronic device 100.

The wired communication interface 220 may be similar to the wired communication interface 120 of the electronic device 100. The wired communication interface 220 may be connected with the electronic device 100 in a wired manner to transceive a signal.

The memory 230 may be similar to the memory 130 of the electronic device 100. The memory 230 may store related data used to perform the operation of the controller 250. For example, the memory 230 may be a non-volatile memory such as a flash memory or a hard disk drive. Alternatively, the memory 230 may be a volatile memory such as a random access memory (RAM).

According to an aspect of an example embodiment, the memory 230 may store information used when the controller 250 determines and corrects the impedance of the PCB 210. The memory 230 may store information used to change a reception characteristic of a signal received in the display device 200. The information used to change the reception characteristic of the signal received in the display device 200 may be an equalizer (EQ) value for processing the signal.

The display 240 may display an image included in the signal received from the electronic device 100. The controller 250 may display the image, which is included in the signal received through the wired communication interface 220, on the display 240.

The controller 250 may control the overall operation of the display device 200. For example, the controller 250 may determine and correct the impedance of the PCB 210. Alternatively, the controller 250 may change a reception characteristic value of the signal for the purpose of receiving the signal from the electronic device 100 when the cable 300 is connected with the electronic device 100 and the display device 200.

Figure 5:
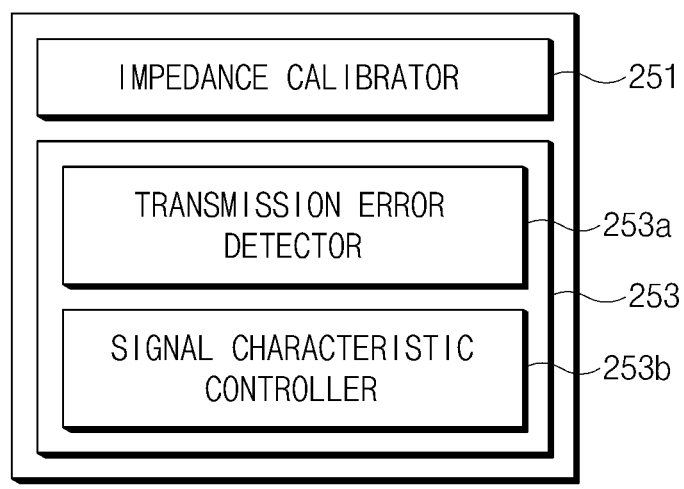
FIG. 5 is a block diagram illustrating a control module of the display device, according to an example embodiment.

FIG. 5 is a block diagram illustrating the controller of the display device, according to an example embodiment.

Referring to FIG. 5, the controller 250 may include an impedance calibrator 251 and a signal calibrator 253. For example, the controller 250 may receive an image signal and a control signal from the electronic device 100 to display an image on the display 240. The controller 250 may be implemented in the form of a system on chip (SoC) including a GPU and a memory.

The impedance calibrator 251 may be similar to the impedance calibrator 141 of the electronic device 100. The impedance calibrator 251 may determine the impedance of the PCB 210 and may correct the impedance of the PCB 210 if the impedance of the PCB 210 is different from a specified impedance (e.g., a design value) stored in the memory 230.

Figure 6:
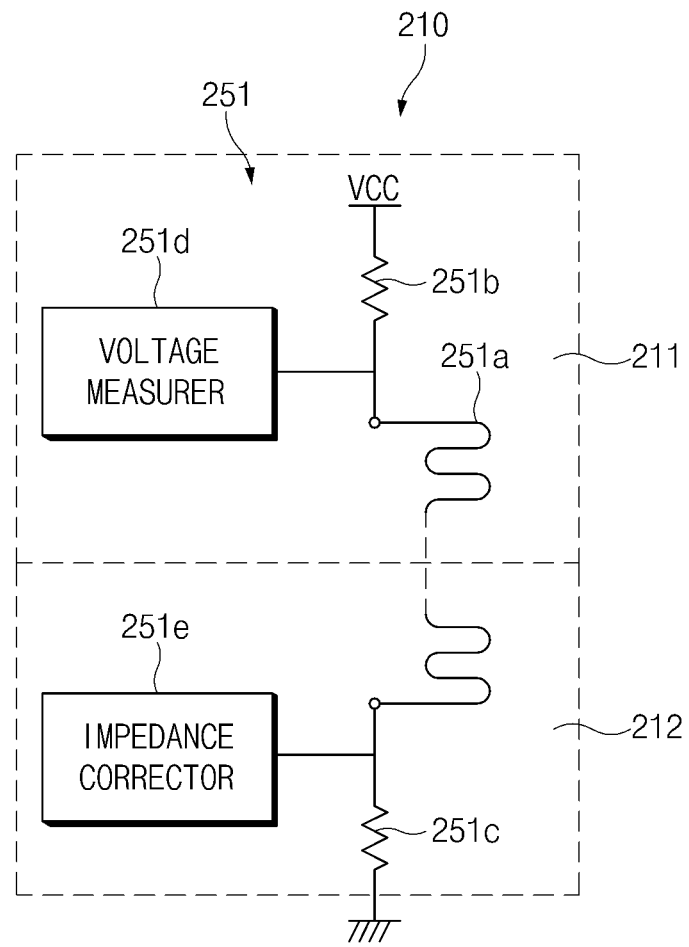
FIG. 6 is a block diagram illustrating an impedance calibrator of the display device, according to an example embodiment.

FIG. 6 is a block diagram illustrating an impedance calibrator of the display device 200, according to various embodiments of the present disclosure.

Referring to FIG. 6, the impedance calibrator 251 may include a conductive line pattern 251a, a first resistor 251b, a second resistor 251c, a voltage measurer 251d, and an impedance corrector 251e.

The conductive line pattern 251a, the first resistor 251b, the second resistor 251c, the voltage measurer 251d, and the impedance corrector 251e may be similar to the conductive line pattern 141a, the first resistor 141b, the second resistor 141c, the voltage measurer 141d, and the impedance corrector 141e of the electronic device 100.

According to an aspect of an example embodiment, the impedance calibrator 251 may determine whether the voltage, which is measured by the voltage measurer 251d, is within a specified voltage range stored in the memory 230 and may determine whether the impedance of the PCB 210 is different from the specified impedance. For example, the impedance calibrator 251 may correct the impedance of the PCB 210 if the impedance of the PCB 210 is determined to be different from the specified impedance. Alternatively, the impedance calibrator 251 may transmit a test signal through the signal calibrator 253 if the impedance of the PCB 210 is determined to be equal to the specified impedance.

Accordingly, if the impedance of the PCB 210 is different from the specified impedance, the controller 250 may perform calibration for correcting the impedance of the PCB 210.

The signal calibrator 253 of FIG. 5 may include a transmission error detector 253a and a signal characteristic controller 253b. The signal calibrator 253 may receive a test signal from the electronic device 100, and may change the reception characteristic of a received signal by checking for the error in the test signal.

The transmission error detector 253a may receive the test signal including specified data from the electronic device 100 through the wired communication interface 220, and may check for an error in the test signal by checking the specified data. For example, the specified data may be data stored in the memory 230. The transmission error detector 253a may check for the error in the test signal by comparing the data, which is included in the received test signal, with data stored in the memory 230. For example, the data stored in the memory 230 may be the same as data stored in the memory 130 of the electronic device 100. Alternatively, the transmission error detector 253a may calculate a CRC value of the data included in the received test signal and may compare the CRC value with a CRC value included in the received test signal, thereby checking for the error in the test signal.

The signal characteristic controller 253b may change the reception characteristic of the signal received in the display device 200. For example, the reception characteristic of the signal received may include an EQ value for processing the signal. For example, the signal characteristic controller 253b may uniformly increase or decrease the strength of the signal across all frequencies by changing the EQ gain value.

According to an aspect of an example embodiment, the signal calibrator 253 may change the reception characteristic of the signal to be received from the electronic device 100 based on the error check information of the test signal.

The signal calibrator 253 may receive the test signal from the electronic device 100 connected with the display device 200 through the cable 300 and may check for the error in the test signal. For example, if the error in the received test signal is not within a specified error tolerance stored in the memory 230, the signal calibrator 253 may perform calibration for changing the reception characteristic of the received signal. Alternatively, if the error in the received test signal is within the specified error tolerance, the signal calibrator 253 may display a message of notifying that the calibration is completed on the display 240.

If the error is present in the received test signal, the signal calibrator 253 may change the reception characteristic of a received signal and may receive the test signal from the electronic device 100. For example, the signal calibrator 253 may sequentially change reception characteristic values of a received signal within a specified range stored in the memory 230 and may receive a plurality of test signals. For example, the signal calibrator 253 may determine whether the errors of the received test signals are within the specified error tolerance by checking for the errors of the test signals. The signal calibrator 253 may determine reception characteristic values of a test signal within the error tolerance, may select one of the determined reception characteristic values of the test signal, and may change the reception characteristic of a signal to be received.

The signal calibrator 253 may select a reception characteristic value that is optimized for stable reception of the signal when selecting the reception characteristic value of the test signal. For example, the signal calibrator 253 may select a value closest to a mean value or a median value of the reception characteristic values of the test signal within the error tolerance.

Alternatively, if the reception characteristic value of the signal is selected, the signal calibrator 253 may display a message of notifying that the calibration is completed on the display.

The transmission error detector 253a may check for the error in the received test signal and may transmit the error check information regarding the test signal to the electronic device 100. The display device 200 may examine the error determine information of the test signal and may perform calibration for changing the reception characteristic of the received signal based on the error check information.

Accordingly, if the error in the received test signal is not within the specified error tolerance, the 250 may perform calibration for changing the reception characteristic of a signal to be received.

According to various example embodiments of the present disclosure described with reference to FIGS. 1 to 6, the electronic device 100 and the display device 200 may determine the impedances of the PCBs 110 and 210. If the determined impedances are different from specified impedances, the electronic device 100 and the display device 200 may perform calibration for correcting the impedances of the PCBs 110 and 210, thereby stably transceiving the signal.

In addition, the electronic device 100 and the display device 200 may mutually transceive a test signal, check for the error in a signal from the electronic device 100 to the display device 200, and perform calibration for changing the characteristic of the signal based on the error check information, thereby stably transceiving the signal.

Figure 7:
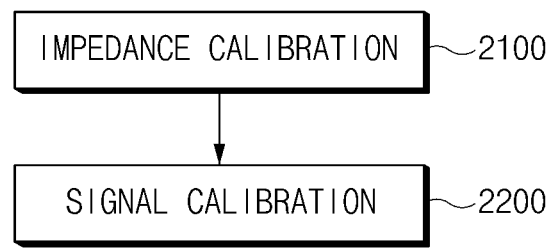
FIG. 7 is a flowchart illustrating a calibration method in the electronic device and the display device, according to an example embodiment.

FIG. 7 is a flowchart illustrating a calibration method of the electronic device and the display device, according to an example embodiment.

The flowchart of FIG. 7 illustrates operations processed in the electronic device 100 and the display device 200. Accordingly, although the details of the electronic device 100 and the display device 200 are omitted from the following description for the convenience of explanation, the descriptions on the electronic device 100 and the display device 200, which have been made with reference to FIGS. 1 to 6, are applicable to the flowchart of FIG. 7.

According to an aspect of an example embodiment, the electronic device 100 and the display device 200 may perform calibrations for correcting impedances of the PCBs 110 and 210 in operation 2100. For example, the electronic device 100 and the display device 200 may perform calibrations for correcting the impedances of the PCBs 110 and 210, respectively.

The electronic device 100 and the display device 200 may perform calibrations for changing the characteristics of signals in operation 2200. For example, the electronic device 100 may transmit a test signal to the display device 200 to check for the error in the test signal. The electronic device 100 may perform calibration for changing the transmission characteristic of a signal to be transmitted based on the error check information. The display device 200 may perform calibration for changing the reception characteristic of a signal received based on the error check information.

Figure 8:
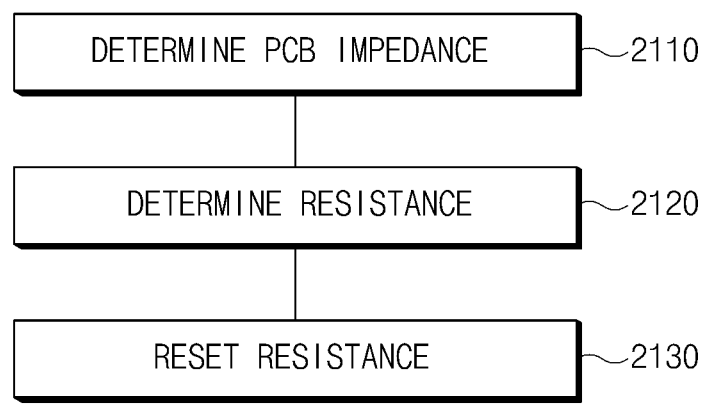
FIG. 8 is a flowchart illustrating an impedance calibration method in the electronic device and the display device, according to an example embodiment.

FIG. 8 is a flowchart illustrating an impedance calibration method of the electronic device and the display device, according to an example embodiment.

The flowchart of FIG. 8 illustrates operations processed in the electronic device 100 and the display device 200. Accordingly, although the details of the electronic device 100 and the display device 200 are omitted for the following description for the convenience of explanation, the descriptions on the electronic device 100 and the display device 200, which have been made with reference to FIGS. 1 to 6, are applicable to the flowchart of FIG. 8.

According to an aspect of an example embodiment, the electronic device 100 and the display device 200 may determine the impedances of the PCBs 110 and 210 in operation 2110. For example, the electronic device 100 and the display device 200 may measure voltages applied to resistors mounted on the PCBs 110 and 210, and may determine whether the measured voltages are within a specific range to determine whether the impedances of the PCBs 110 and 210 are different from specified impedances.

In operation 2120, the electronic device 100 and the display device 200 may connect variable resistors with the resistors and may select or determine resistances of the variable resistors if the impedances of the PCBs 110 and 210 are determined to be different from the specified impedance. For example, the electronic device 100 and the display device 200 may connect the variable resistors to the resistors, measure the voltages applied to the resistors, and determine whether the measured voltages are within specified range.

In operation 2130, the electronic device 100 and the display device 200 may select resistances of the variable resistors and may adjust the impedances of the PCBs 110 and 210. For example, each of the electronic device 100 and the display device 200 may select one of resistances corresponding to the determined voltages such that the electronic device 100 and the display device 200 correct the impedance of the PCBs 110 and 210, respectively.

Figure 9:
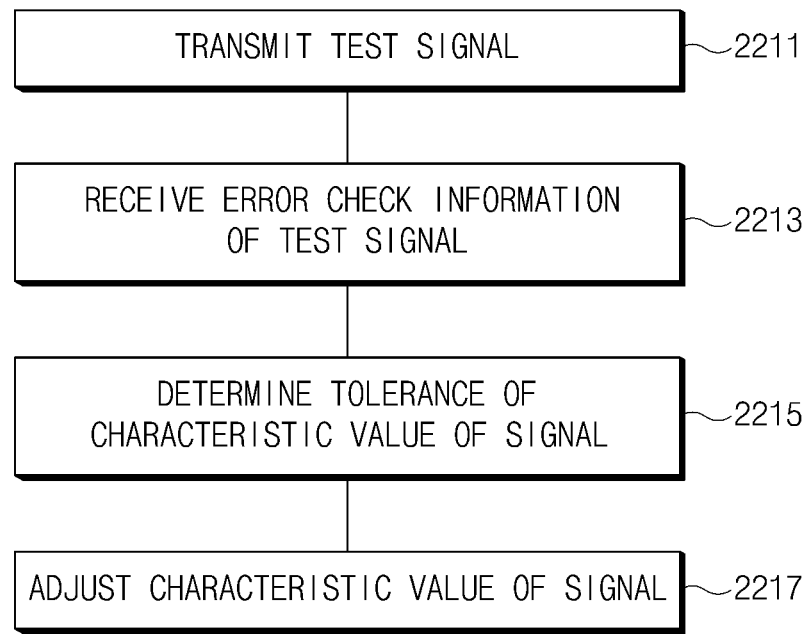
FIG. 9 is a flowchart illustrating a signal calibration method of the electronic device, according to an example embodiment.

FIG. 9 is a flowchart illustrating a signal calibration method of the electronic device, according to an example embodiment.

According to an aspect of an example embodiment, in operation 2211, the electronic device 100 may transmit a test signal to the display device 200. For example, the electronic device 100 may transmit a test signal including data specified for each frequency band and the test signal may be transmitted through each line of the cable 300.

In operation 2213, the electronic device 100 may receive error check information of the test signal from the display device 200. The electronic device 100 may transmit a test signal including specified data to the display device 200, and the display device 200 may check for the error in the test signal and may transmit the error check information to the electronic device 100.

In operation 2215, the electronic device 100 may determine the error tolerance of a transmission characteristic value of a transmitted signal based on the received error check information. For example, the electronic device 100 may sequentially change transmission characteristic values of the transmitted signal within the specified range, transmit a plurality of test signals, and receive error check information of the test signals. The electronic device 100 may examine the received error check information to determine the transmission characteristic values of a test signal within the specified error tolerance.

In operation 2217, the electronic device 100 may select and adjust the determined transmission characteristic value of the signal. For example, the electronic device 100 may select one of the transmission characteristic values of the signal within the specified error tolerance and may change a transmission characteristic of a signal transmitted.

Figure 10:
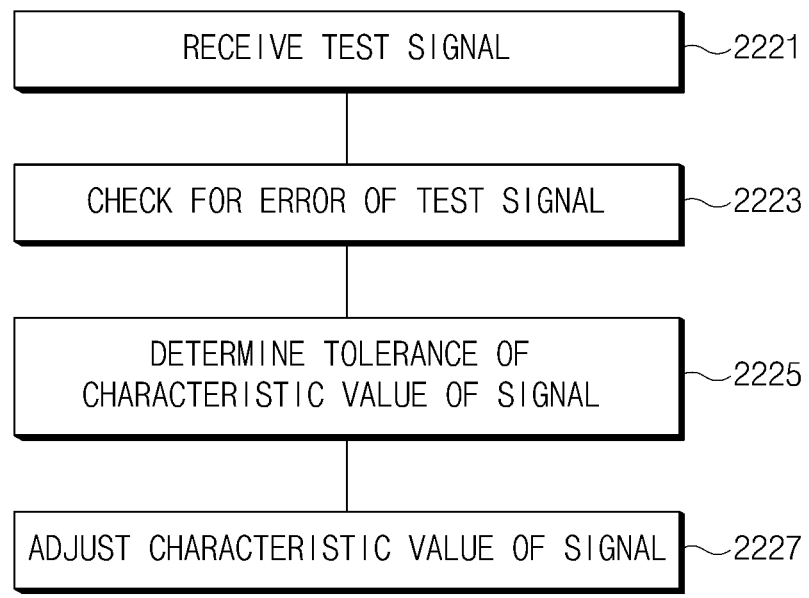
FIG. 10 is a flowchart illustrating a signal calibration method of the display device, according to an example embodiment.

FIG. 10 is a flowchart illustrating a signal calibration method of the display device, according to an example embodiment.

According to an aspect of an example embodiment, in operation 2221, the display device 200 may receive a test signal including specified data from the electronic device 100.

In operation 2223, the display device 200 may check for the error in the received test signal. For example, the display device 200 may examine the specified data to check for the error. The display device 200 may transmit the determined error check information of the test signal to the electronic device 100.

In operation 2225, the display device 200 may determine the tolerance of a reception characteristic value of a received signal based on the error check information. For example, the display device 200 may sequentially change reception characteristic values of the received signal within the specified range, may receive a plurality of test signals, and may check for the errors of the test signals. The display device 200 may determine the reception characteristic value of the signal within the specified error tolerance, based on the determined error check information of the test signal.

In operation 2227, the display device 200 may select and adjust the determined reception characteristic value of a signal. For example, the display device 200 may select one of the reception characteristic values of a signal within the error tolerance, and may change the reception characteristic of a signal received.

The term "module" used in the present disclosure may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in computer-readable storage media in the form of a program module. The instructions, when executed by a processor (e.g., the processor 120), may cause the one or more processors to perform a function or operation corresponding to the instructions. The computer-readable storage media, for example, may be the memory 130 or the memory 230.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware unit may be configured to operate via one or more software modules for performing an operation of various embodiments of the present disclosure, and vice versa.

A module or a program module according to various example embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

While the present disclosure has been shown and described with reference to various example embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a wired communication interface connected to a display device through a cable;
a controller circuit configured to transmit a test signal including specified data, to the display device through the wired communication interface, and receive error check information regarding the test signal from the display device through the wired communication interface;
a printed circuit board (PCB) on which the wired communication interface and the controller circuit are disposed;
a conductive line pattern formed on the PCB;
a first resistor connected between a first end of the conductive line pattern of the PCB and a power supply; and
a second resistor connected between a second end of the conductive line pattern of the PCB and a ground,
wherein the controller circuit is further configured to:
determine an impedance of the PCB;
perform calibration for adjusting the impedance of the PCB, based on the determined impedance being different from a specified impedance;
sequentially change transmission characteristic values of the test signal within a specified range to transmit a plurality of test signals;
perform calibration for changing a transmission characteristic of a signal to be transmitted to the display, based on the error check information regarding the plurality of test signals; and
measure a first voltage applied to at least one of the first resistor and the second resistor, and determine the impedance of the PCB to be different from the specified impedance if the first voltage is outside a specified voltage range.

2. The electronic device of claim 1, wherein the determined transmission characteristic includes at least one of strength, pre-emphasis-, a duty ratio, and skew of the signal.

3. The electronic device of claim 1, wherein the controller circuit is configured to:
examine the error check information regarding the plurality of test signals to determine the transmission characteristic values of the signal within a specified error tolerance; and
select one of the determined transmission characteristic values of the signal.

4. The electronic device of claim 3, wherein the controller circuit is configured to select a value, among the transmission characteristic values of the signal, that is closest to one of a mean value and a median value of the determined transmission characteristic values of the signal.

5. The electronic device of claim 1, wherein the controller circuit is configured to generate the plurality of test signals for each frequency band and receive the error check information.

6. The electronic device of claim 1, wherein the controller circuit is configured to generate the plurality of test signals for each line of the cable and receive the error check information.

7. The electronic device of claim 1, wherein the controller circuit is configured to:
connect a variable resistor to at least one of the first resistor and the second resistor, sequentially change a resistance of the variable resistor, and measure second voltages across at least one of the first resistor and the second resistor; and
determine third voltages, which is within the specified range, among the second voltages, and select one of resistances corresponding to the third voltages.

8. The electronic device of claim 7, wherein the controller circuit is configured to select a specific resistance, among the resistances corresponding to the third voltages, that is closest to one of a mean value and a median value of the resistances corresponding to the third voltages.

9. A display device comprising:
a wired communication interface connected to an electronic device through a cable;
a controller circuit configured to receive a test signal including specified data from the electronic device through the wired communication interface, examine the specified data, and check for an error in the test signal;
a printed circuit board (PCB) on which the wired communication interface and the controller circuit are disposed;
a conductive line pattern formed on the PCB;
a first resistor connected between a first end of the conductive line pattern of the PCB and a power supply; and
a second resistor connected between a second end of the conductive line pattern of the PCB and a ground,
wherein the controller circuit is further configured to:
determine an impedance of the PCB;
perform calibration for adjusting the impedance of the PCB, based on the impedance being different from a specified impedance;
sequentially change reception characteristic values of the test signal within a specified range to receive a plurality of test signals;
perform calibration for changing a reception characteristic of a signal to be received from the electronic device, based on error check information regarding the plurality of test signals; and
measure a first voltage applied to at least one of the first resistor and the second resistor, and determine the impedance of the PCB to be different from the specified impedance if the first voltage is outside a specified voltage range.

10. The display device of claim 9, wherein the controller circuit is configured to transmit the error check information regarding the plurality of test signals to the electronic device through the wired communication interface.

11. The display device of claim 9, wherein the reception characteristic is an equalizer value for processing the signal.

12. The display device of claim 9, wherein the controller circuit is configured to:
examine the error check information regarding the plurality of test signals to determine reception characteristic values of the signal within a specified error tolerance; and
select one of the determined reception characteristic values of the signal.

13. The display device of claim 12, wherein the controller circuit is configured to select a value, among the reception characteristic values of the signal, that is closest to one of a mean value and a median value of the determined reception characteristic values of the signal.

14. The display device of claim 9, wherein the controller circuit is configured to:
connect a variable resistor to at least one of the first resistor and the second resistor, sequentially change a resistance of the variable resistor, and measure second voltages across at least one of the first resistor and the second resistor; and
determine third voltages, which is within the specified range, among the second voltages, and select one of resistances corresponding to the third voltages.

15. A display system comprising:
a display device; and
an electronic device connected with the display device through a cable to transmit a test signal including specified data to the display device, and to receive error check information regarding the test signal from the display device, wherein the electronic device includes a PCB
wherein the display device connected with the electronic device through the cable to receive the test signal including the specified data from the electronic device, and configured to examine the specified data to check for an error in the test signal, and to transmit the error check information regarding the test signal to the electronic device,
wherein the electronic device is configured to:
determine an impedance of the PCB,
perform calibration for adjusting the impedance of the PCB if the determined impedance is different from a specified impedance,
sequentially changes transmission characteristic values of the test signal within a first specified range to transmit a plurality of test signals, and
performs calibration for changing a transmission characteristic of a signal to be transmitted to the display device based on the error check information regarding the plurality of test signals, and
wherein the display device is configured to:
sequentially changes reception characteristic values of the test signal within a second specified range to receive the plurality of test signals; and
performs calibration for changing a reception characteristic of the signal received from the electronic device based on the error check information regarding the plurality of test signals.

16. The display system of claim 15, wherein the transmission characteristic includes at least one of strength, pre-emphasis, a duty ratio, and skew of the signal.

* * * * *